United States Patent [19]
Leiphart

[11] Patent Number: 5,997,699
[45] Date of Patent: Dec. 7, 1999

[54] INSITU FACETING DURING DEPOSITION

[75] Inventor: Shane P. Leiphart, Boise, Id.

[73] Assignee: Micron Technology Inc., Boise, Id.

[21] Appl. No.: 08/629,364

[22] Filed: Apr. 8, 1996

[51] Int. Cl.$^6$ ................................................. C23C 14/34
[52] U.S. Cl. ................................ 204/192.3; 204/192.12; 204/192.17; 204/192.32; 204/192.37; 438/584; 438/675
[58] Field of Search ................... 204/192.12, 192.15, 204/192.17, 192.3, 191.32, 192.37; 437/192, 203, 228; 156/644.1, 662.1; 438/675, 694, 695, 696, 700, 701, 576, 584

[56] References Cited

U.S. PATENT DOCUMENTS

| | | | |
|---|---|---|---|
| 4,839,306 | 6/1989 | Wakamatsu | 427/228 |
| 4,963,239 | 10/1990 | Shimamura et al. | 204/192.3 |
| 4,999,096 | 3/1991 | Nihei et al. | 204/192.3 |
| 5,108,570 | 4/1992 | Wang | 204/192.3 |
| 5,371,042 | 12/1994 | Ong | 437/192 |

OTHER PUBLICATIONS

Rossnagel et al. "Metal ion deposition from ionized magnetron sputtering discharge", J. Vac. Sci. Technol. B, vol. 12, No. 1, Feb. 1994.

*Primary Examiner*—Rodney G. McDonald
*Attorney, Agent, or Firm*—Workman Nydegger & Seeley

[57] ABSTRACT

A semiconductor substrate having thereon a surface including features to be filled is placed in a vacuum chamber having a high density plasma source and a target of material to be deposited. A vacuum is drawn, and a plasma is struck in a gas by means of the high density plasma source. The substrate is then biased to cause ions from the plasma to bombard the substrate with energies sufficient to facet top corners of features on the surface of the substrate. After a desired amount of faceting has occurred, the target is biased to cause ions from the plasma to sputter the target, resulting in a plasma comprised of target material and the gas. The substrate is then biased sufficiently to provide a near perpendicular flow of ions of target material to the substrate, but at sufficiently low energy to deposit a film of the material to be deposited. The substrate bias may be held sufficiently high to prevent or reduce buildup on the facets. The substrate bias may be adjusted during the deposition process to allow increased deposition on the facets. Alternatively, the target may be biased from the start, resulting in formation of a plasma comprised of both the gas and the material to be deposited. Ions from this plasma may then be used to first facet the surface of the substrate by employing a high negative substrate bias, then to deposit a film of the material to be deposited by employing a lower negative substrate bias.

50 Claims, 3 Drawing Sheets

INSITU FACETING DURING DEPOSITION

BACKGROUND OF THE INVENTION

1. The Field of the Invention

The present invention relates to methods of deposition of materials to fill a topography on a surface during the manufacture of semiconductor devices. More particularly, the present invention is directed to a method of deposition of materials to fill a topography which includes faceting of openings in situ with deposition of materials to fill the openings during the manufacture of semiconductor devices.

2. The Relevant Technology

In the continuing quest to reduce the minimum feature size of integrated circuits, the aspect ratio, i.e., the ratio of height to width, of structures to be formed has increased. This is the natural result of attempting to fit as many structures as possible within a given area.

High aspect ratios for structures such as contacts and vias present a challenge for deposition techniques.

Contacts and vias are formed by first etching holes or trenches in an etchable layer, usually silicon dioxide. The hole is then cleaned, then filled with deposited conductive material, typically metal such as aluminum or tungsten deposited by sputtering. To decrease contact resistance, a thin layer of titanium may be sputter deposited in the hole before filling with aluminum or tungsten.

FIG. 1 shows a partial cross section of a partially formed semiconductor device having a substrate or underlying layer 12 with an etchable layer 14 thereon in which has been etched a contact hole or via. The result is a surface on substrate 12 including horizontally oriented surface portions 16 and vertically oriented surface portions 18, joined at top corners 20 and bottom corners 22.

In typical sputter deposition, sputtered flux from a target of material to be deposited approaches a surface at various directions D, as shown in FIG. 2. Top corners 20 shield the lower portions of vertically oriented surface portions 18 from some of the sputtered flux, such that a buildup of a deposited film 24 occurs near upper corners 20 as shown in FIG. 2. When an additional deposited film 26 is deposited to fill the rest of the hole, a void 27 is formed in additional deposited film 26 because of the buildup near upper corners 20. Void 27 causes increased resistance in the contact or via structure, and in severe cases can be large enough to prevent reliable contact all together.

One way to decrease the formation of voids such as void 27 is to etch angled surface portions (facets) 28 on upper corners 20, as shown in FIG. 4, prior to filling the hole. Facets 28 allow more of the sputtered flux to reach the lower portions of the hole, resulting in less likelihood of creating a void. Facets 28 are typically etched in a separate step before filling the hole, after which separate step, a clean step may be required. It would thus be an advantage to combine into one process the steps of etching facets 28 and of depositing a material to fill the hole.

SUMMARY AND OBJECTS OF THE INVENTION

An object of the present invention is to provide a method of faceting a surface and depositing on the surface in situ in the same process chamber.

A further object of the present invention is to provide an improved method for filling high aspect ratio holes and trenches such as contact holes and vias.

A still further object of the present invention is to provide a method of sputter deposition for high-aspect ratio layers that decreases the likelihood of void formation.

In accordance with the present invention, a semiconductor substrate having thereon a surface including features to be filled, such as contact holes or vias, is placed in a vacuum chamber that also contains a high density plasma source and a target of material to be deposited. A vacuum is drawn, and a plasma is struck in a gas by means of the high density plasma source. The plasma generated by the said high density plasma source creates a high density of ions in the plasma, with an ionization rate of 50 percent or more. The substrate is biased to cause ions from the plasma to bombard the substrate with energies sufficient to create a modified non-horizontal portion of the surface topography of the bombarded surface of the substrate. An example of the created modified non-horizontal portion of the surface topography of the bombarded surface of the substrate is a facet created at the top corners on the substrate. As such, the bombardment facets the topography of a surface on the substrate.

After a desired amount of faceting has occurred, the target is biased to cause ions from the plasma to sputter the target, resulting in a plasma comprised of target material and the gas. The substrate is then biased sufficiently to provide a near perpendicular flow of ions of target material to the substrate, but at sufficiently low energy to deposit a film of the material to be deposited. The substrate bias may be held sufficiently high to prevent or reduce buildup on the facets. The substrate bias may be adjusted during the deposition process to allow increased deposition on the facets.

Alternatively, the target may be biased from the beginning of the process, resulting in formation of a plasma comprised of both the gas and the material to be deposited. Ions from this plasma may then be used to first facet the surface of the substrate by employing a high negative substrate bias, then to deposit a film of the material to be deposited by employing a lower negative substrate bias.

These methods allow both faceting of a surface and deposition on that surface of a material to be deposited to occur in situ in the same process chamber without intervening process steps. This allows greater control, greater throughput, and, particularly for high aspect ratio contacts and vias, more reliable filling with less void formation.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained may be more fully explained, a more particular description of the invention briefly described above will be rendered by reference to specific embodiments or applications thereof which are illustrated in the appended drawings. Understanding that these drawings depict only typical embodiments or applications of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention introduces a method of faceting and filling the features on the surface of a semiconductor substrate in situ in one process chamber.

Figure 5:
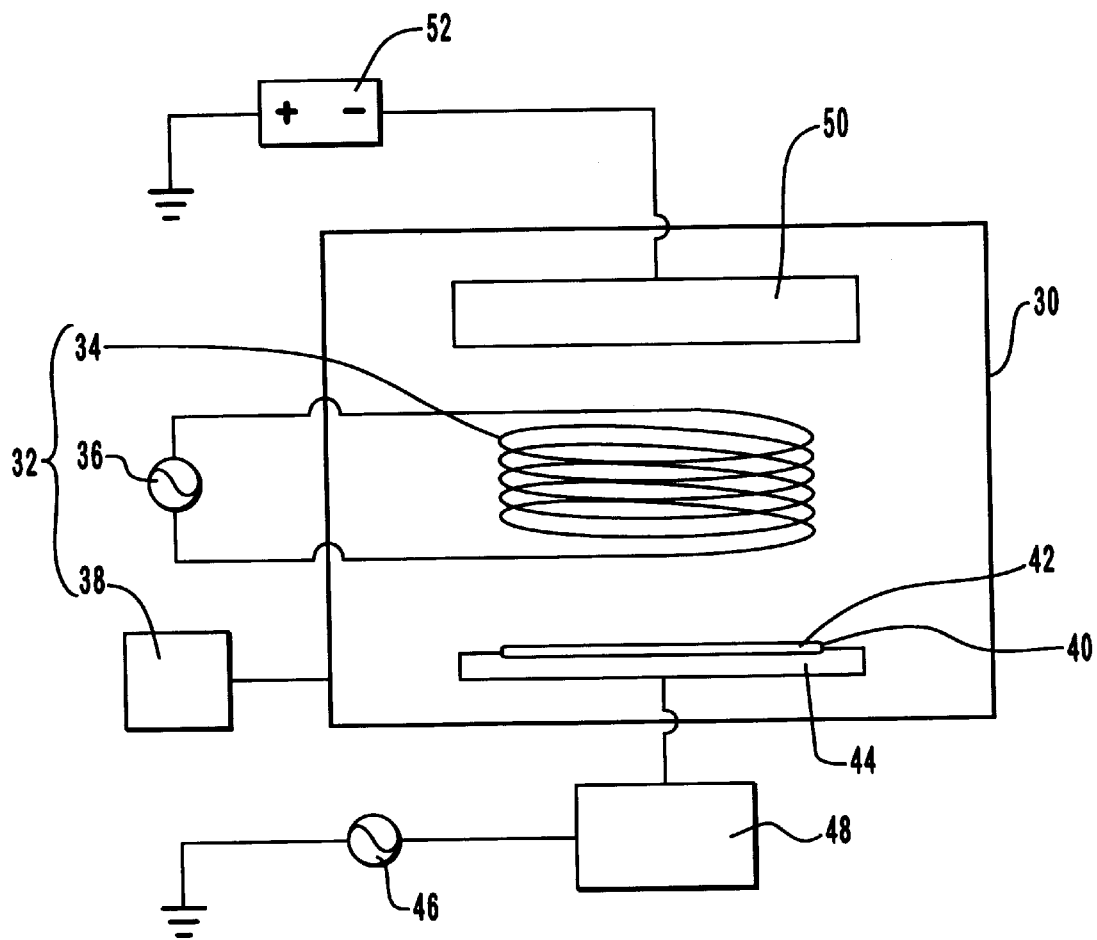
FIG. 5 is a schematic diagram of some significant elements of a presently preferred apparatus for use in performing the methods of the present invention.

Significant elements of a process chamber currently preferred for performing the present invention are diagrammed schematically in FIG. 5. A vacuum chamber 30 contains a high density plasma generator 32 which includes both an inductive coil 34 coupled to an RF power supply 36 and a gas source 38. A substrate 40 having a surface 42 to be faceted and deposited upon is positioned on a susceptor 44 near inductive coil 34. Susceptor 44 is coupled to an RF power supply 46 through an impedance matching network 48 with a blocking capacitor. A target 50 of material to be deposited is located near inductive coil 34 and opposite susceptor 44. Target 50 is coupled to a bias power supply 52.

To perform the method of the present invention, a plasma is struck in a gas in chamber 30 by employing high density plasma generator 32. High density plasma generator 32 is capable of sustaining extremely high ionization rates, such as 50% or more ionization, and is capable of ionizing sputtered flux from target 50. Argon is the preferred gas, but other inert gases and even gas combinations and non-inert gases may be employed as is desired for the particular application. Optimal power levels, frequencies, and pressure ranges for a particular application may be easily ascertained by those of skill in the art.

Bias power supply 52 coupled to target 50 is initially left unpowered, such that target 50 is not sputtered. Instead, RF power supply 46 and impedance matching network 48 will bias susceptor 44 and substrate 40 with a sufficiently large negative bias to cause gas ions from the plasma to accelerate to substrate 40 and to bombard surface 42 with sufficient energy to create facets at top corners of features situated on surface 42.

After sufficient faceting has occurred, target 50 is biased by power supply 52 to cause sputtering of target 50. The bias on susceptor 44 and substrate 40 is then reduced to allow deposition of a film of material to be deposited on surface 42. The bias on susceptor 44 and substrate 40 may be kept sufficiently high to resputter all material deposited on facets on surface 42. This is possible because faceted surfaces are preferentially sputtered, so that the growing film of material to be deposited is sputtered away on facets but not on horizontal surfaces. The bias on susceptor 44 and substrate 40 may also be further adjusted during deposition to control the buildup of deposited film on the facets on surface 42.

Alternatively, target 50 may be biased from the beginning of the process, creating a plasma comprised of both the gas and the material. Ions from this combined plasma may be used to first facet surface 42 of substrate 40 by employing a high negative substrate bias, then to deposit a film of the material to be deposited by employing a lower negative substrate bias.

As an additional alternative, when the material to be deposited has begun to be sputtered from target 50 and is sufficiently ionized by the high density plasma generator, the gas from gas source 38 may be shut off, and a plasma may be sustained by self-sputtering of target 50. This plasma may be used to facet surface 42, to deposit on surface 42, or to do both.

Figure 1:
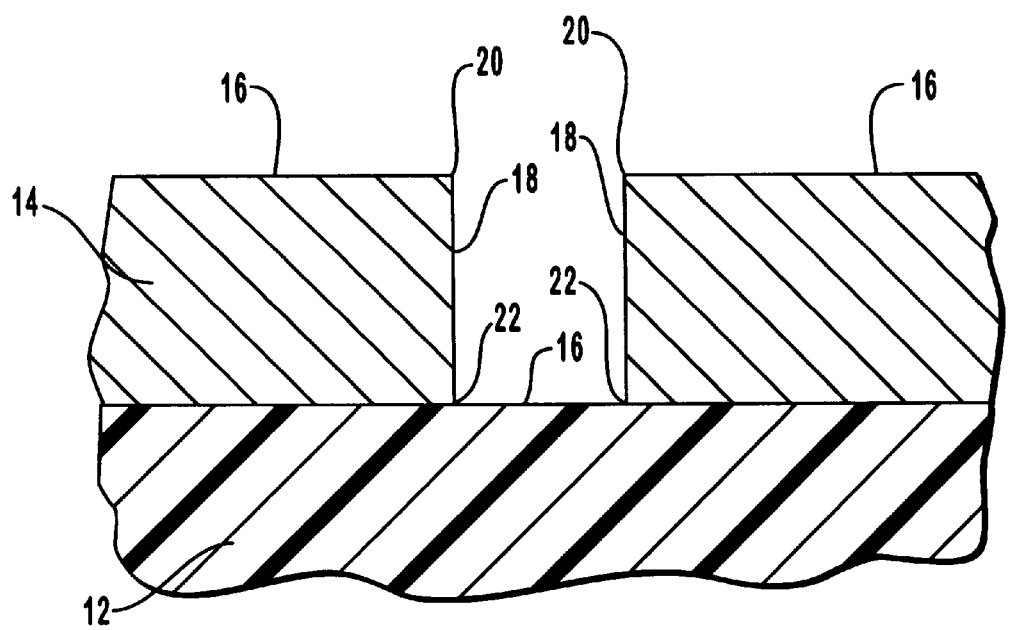
FIG. 1 is a partial cross section of a partially formed integrated circuit device.
Figure 2:
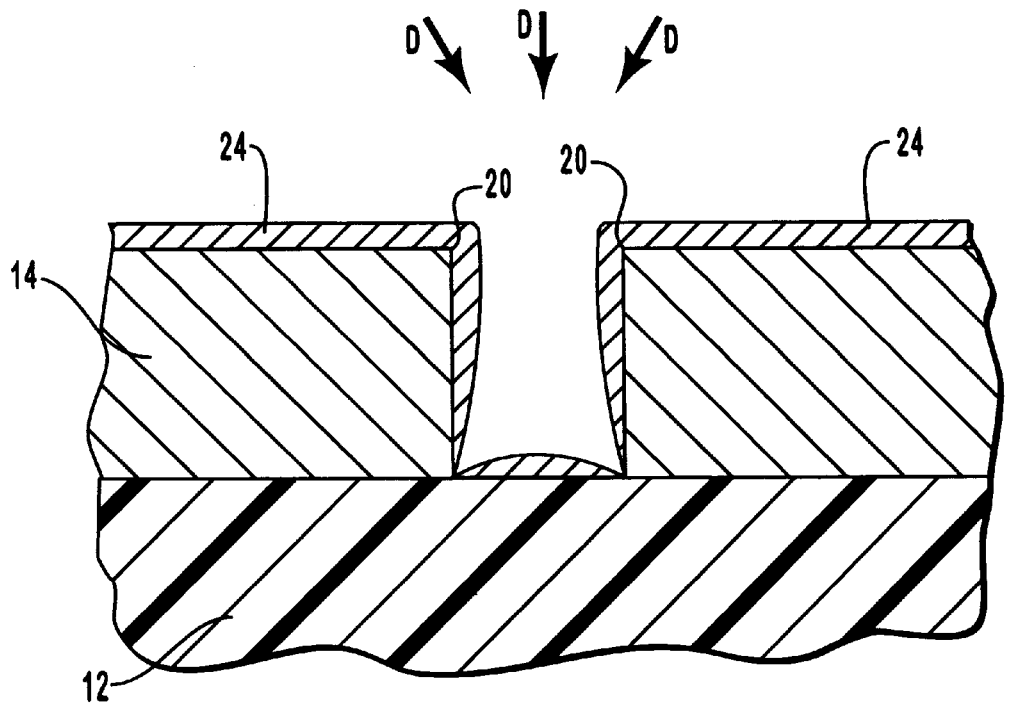
FIG. 2 is the cross section of FIG. 1 after deposition of a film.
Figure 3:
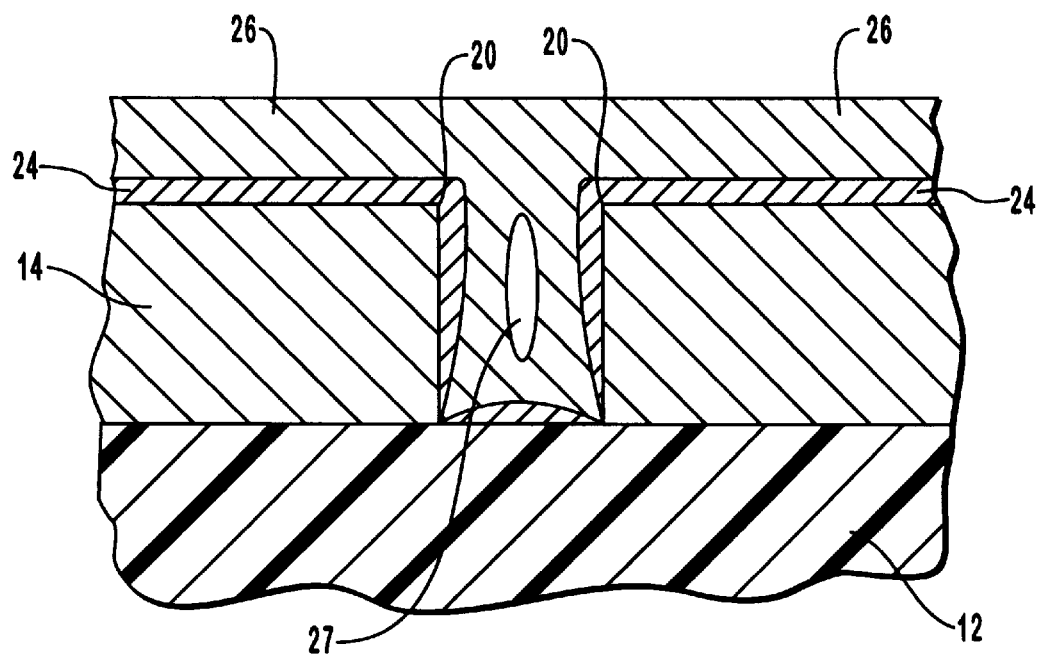
FIG. 3 is the cross section of FIG. 2 after deposition of an additional film.
Figure 4:
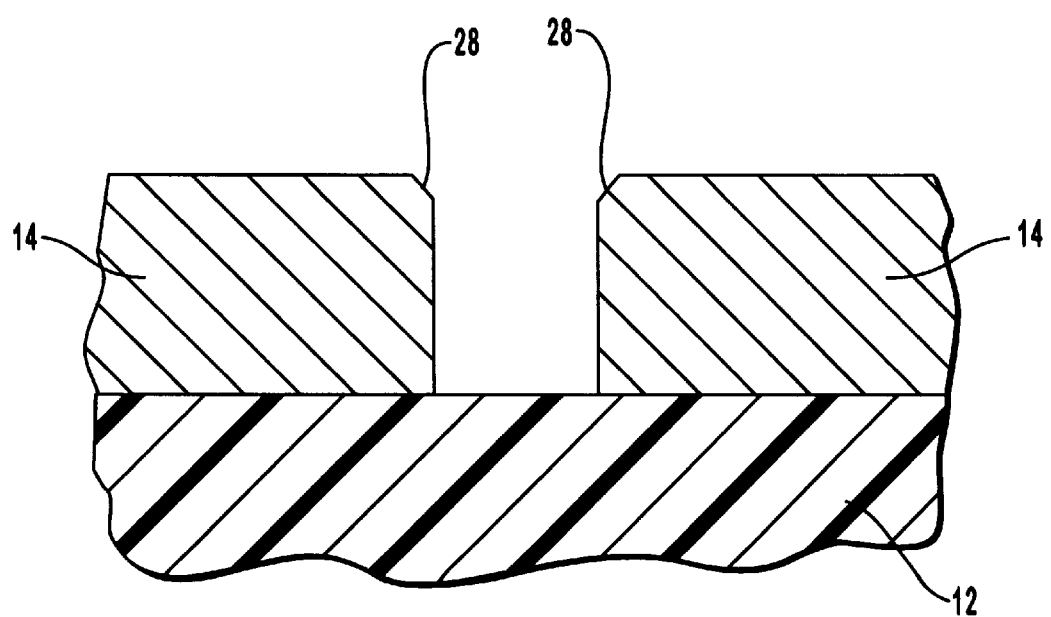
FIG. 4 is the cross section of FIG. 1 after etching facets on the upper corners of the structure shown in FIG. 1.

While the present invention is not limited to a particular application or use, the presently most preferred use of the present invention is for the faceting of contact holes and vias in conjunction with a deposition of titanium in contact holes and vias. Only a relatively thin layer of titanium is employed. Aluminum or preferably tungsten is then deposited in another step to completely fill the contact or via. While this application is presently preferred, other applications are also advantageous, including aluminum or tungsten fill with faceting. By way of example, FIG. 3 may be interpreted as having a titanium layer 24 subadjacent to a tungsten layer 26, with the exception that void 27 is not present, and that corners 20 are faceted as in FIG. 4. When the ninety degree or orthagonal edges at upper corners 20 seen in FIGS. 2 and 3 are removed, there remains an angled surface portion that joins the horizontally oriented portions and the vertically oriented portions at upper corners 20. The angled surface portion is seen as a faceted area 28 in FIG. 4.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for in situ faceting of and deposition on a semiconductor substrate, said method comprising:
   providing a chamber with a high density plasma source therein;
   providing in said chamber a target of material to be deposited;
   positioning in said chamber a semiconductor substrate having a recess therein and an opening to said recess;
   biasing said semiconductor substrate;
   bombarding said opening to said recess in said semiconductor substrate in said chamber with ions from a plasma having an ionization rate of 50% or more generated by said high density plasma source so as to form facets at said opening to said recess of said semiconductor substrate;
   biasing said target and reducing the bias on the semiconductor substrate;
   sputtering said target in said chamber with ions from said plasma having an ionization rate of 50% or more generated by said high density plasma source while controlling said bias on said target and said semiconductor substrate so as to:
   allow sputtered flux from said target to deposit within said recess;
   preventing sputtered flux from accumulating on said facets by resputtering the sputtered flux that is deposited on said facets.

2. The method as defined in claim 1, wherein said plasma source includes an inductive coil coupled to an RF power supply.

3. The method as defined in claim 1, wherein said material to be deposited comprises titanium.

4. The method as defined in claim 1, wherein said recess comprises a contact hole.

5. The method as defined in claim 1, wherein said recess of said semiconductor substrate comprises a via hole.

6. The method as defined in claim 1, wherein bombarding said opening to said recess in said semiconductor substrate comprises negatively biasing said semiconductor substrate relative to said plasma.

7. The method as defined in claim 6 wherein, during bombarding said opening to said recess in said semiconductor substrate the target is unbiased.

8. The method as defined in claim 6, wherein sputtering said target further comprises:
negatively biasing said target so as to sputter said target; and
negatively biasing said semiconductor substrate at a bias level so as to:
allow a film of said material to be deposited on a horizontal surface on said semiconductor substrate without resputtering the same; and
cause the rate of accumulation of said film of said material on said facets at said opening to said recess to be less than the rate of accumulation of said film of said material on said horizontal surface on said semiconductor substrate.

9. A method for in situ faceting of and deposition on a semiconductor substrate, said method comprising:
providing a chamber with a high density plasma source therein;
providing in said chamber a target of a material to be deposited;
positioning in said chamber a semiconductor substrate having a horizontally disposed surface, the surface having an opening therein to a recess in said semiconductor substrate;
providing a gas in said chamber;
striking a plasma of said gas having an ionization rate of 50% or more in said chamber generated by said high density plasma source;
sputtering said target in said chamber with ions from said plasma of said gas having an ionization rate of 50% or more so as to produce a sputtered flux of said material to be deposited;
ionizing, using said high density plasma source, said sputtered flux of said material to be deposited so as to have an ionization rate of at least fifty percent in said plasma of both said gas and said material to be deposited;
increasing a bias on the semiconductor substrate and bombarding said surface of said semiconductor substrate within said chamber with ions of both said plasma of said gas having an ionization rate of 50% or more and said material to be deposited, whereby said ions form facets at said opening to said recess; and
reducing the bias on the semiconductor substrate and bombarding said semiconductor substrate within said chamber with lower energy ions than said ions from both said plasma of said gas having an ionization rate of 50% or more and said material to be deposited, whereby:
there is deposited a film of said material within said recess; and
there is a lower rate of accumulation of said film on said facets at the opening to said recess due to resputtering of the same than the rate of accumulation of said film on said horizontally disposed surface of said semiconductor substrate.

10. The method as defined in claim 9, wherein said plasma source includes an inductive coil coupled to an RF power supply.

11. The method as defined in claim 9, wherein said material to be deposited comprises titanium.

12. The method as defined in claim 9, wherein said recess within said semiconductor substrate comprises a contact hole.

13. The method as defined in claim 9, wherein said recess within said semiconductor substrate comprises a via hole.

14. The method as defined in claim 9, wherein said gas comprises an inert gas.

15. The method as defined in claim 14, wherein said inert gas comprises argon.

16. The method as defined in claim 9, wherein bombarding said semiconductor substrate with lower energy ions further comprises:
bombarding said semiconductor substrate with ions having an energy sufficient to:
substantially prevent accumulation of said film of said material on said facets at said opening to said recess by resputtering the material that is deposited on said facets at said opening to said recess; and
allow accumulation of said film of said material within said recess.

17. A method for in situ faceting of and deposition on a semiconductor substrate, said method comprising:
providing a chamber with a high density plasma source therein;
providing in said chamber a target of material to be deposited;
positioning in said chamber a semiconductor substrate having a surface to be faceted and to be deposited upon, said surface having horizontally oriented surface portions and vertically oriented surface portions, said horizontally oriented surface portions and said vertically oriented surface portions joining at upper and lower corners on said surface;
increasing a bias on said semiconductor substrate and bombarding said semiconductor substrate in said chamber with ions from a plasma having an ionization rate of 50% or more generated by said high density plasma source, whereby there is removed one or more orthogonal edges at said upper corners on said surface and leaving an angled surface portion joining horizontally oriented surface portions and vertically oriented surface portions at said upper corners, said angled surface portion being a faceted area of said surface of said semiconductor substrate at said upper corners; and
decreasing the bias on said semiconductor substrate and sputtering said target in said chamber in said plasma having an ionization rate of 50% or more generated by said high density plasma source so as to:
allow sputtered flux from said target to deposit without resputtering on said horizontally oriented surface portions of said surface; and
resputtering the sputtered flux deposited on the faceted area of said surface of said semiconductor so as to disallow said sputtered flux from said target to accumulate on said faceted area of said surface of said semiconductor.

18. The method as defined in claim 17, wherein said plasma source includes an inductive coil coupled to an RF power supply.

19. The method as defined in claim 17, wherein said material to be deposited comprises titanium.

20. The method as defined in claim 17, wherein said surface of said semiconductor substrate comprises contact holes.

21. The method as defined in claim 17, wherein said surface of said semiconductor substrate comprises via holes.

22. The method as defined in claim 17, wherein bombarding said semiconductor substrate comprises negatively biasing said semiconductor substrate relative to said plasma.

23. The method as defined in claim 22, wherein during bombarding said semiconductor substrate the target is unbiased.

24. The method as defined in claim 22, wherein sputtering said target comprises:
   negatively biasing said target so as to sputter said target; and
   negatively biasing said semiconductor substrate at a bias level so as to:
      allow a film of said material to be deposited on said horizontally oriented surface portions of said surface; and
      resputter the material that is deposited upon the faceted area of said surface to reduce the rate of deposition of said film on said faceted areas of said surface relative to the rate of deposition of said film on said horizontally oriented surface portions of said surface.

25. A method for depositing material on a semiconductor substrate comprising:
   providing a chamber with a high density plasma source therein;
   providing in said chamber a target of a material to be deposited;
   positioning in said chamber a semiconductor substrate having a surface with a surface topology thereon;
   bombarding said semiconductor substrate in said chamber with ions from a plasma having an ionization rate of 50% or more generated by said high density plasma source while negatively biasing said semiconductor substrate relative to said plasma generated by said high density plasma source so as to create a modified portion of said surface topography of said surface of said semiconductor substrate; and
   sputtering said target in said chamber with ions from said plasma having an ionization rate of 50% or more generated by said high density plasma source while negatively biasing said target relative to said plasma having an ionization rate of 50% or more generated by said high density plasma source and while changing the bias on the semiconductor substrate so as to allow sputtered flux from said target:
      to be resputtered off of the modified portion of said surface topography of said surface of said semiconductor substrate; and
      to not be resputtered off of portions of said surface topography that are perpendicularly oriented to the direction of the flux that is sputtered from the target deposit on said surface.

26. The method as defined in claim 25, wherein said plasma source includes an inductive coil coupled to an RF power supply.

27. The method as defined in claim 26, wherein said material to be deposited comprises titanium.

28. The method as defined in claim 25, wherein said surface of said semiconductor substrate comprises contact holes.

29. The method as defined in claim 25, wherein said surface of said semiconductor substrate comprises via holes.

30. The method as defined in claim 25, wherein during bombarding said semiconductor substrate the target is unbiased.

31. The method as defined in claim 25, wherein sputtering said target further comprises negatively biasing said semiconductor substrate at a bias level so as to allow a film of said material to be deposited on said surface, and so as to reduce the rate of deposition of said film of said material on said modified portion of said surface topography of said surface of said semiconductor substrate relative to the rate of deposition of said film of said material other than on said modified portions of said surface topography of said surface of said semiconductor substrate.

32. A method for filling a recess by depositing a material therein, said method comprising:
   providing a chamber with a high density plasma source therein;
   providing in said chamber a target of a material to be deposited;
   positioning in said chamber a semiconductor wafer having a recess therein, the recess having an opening thereto;
   providing a gas in said chamber;
   striking a plasma of said gas having an ionization rate of 50% or more generated by said high density plasma source;
   sputtering said target with ions from said plasma of said gas having an ionization rate of 50% or more while negatively biasing said target so as to produce a sputtered flux of said material to be deposited;
   ionizing, using said high density plasma source, said sputtered flux of said material to be deposited so as to maintain ions having an ionization rate of at least fifty percent in said plasma of both said gas and said material to be deposited;
   bombarding said surface of said semiconductor wafer in said chamber with ions of both said plasma of said gas and said material to be deposited while negatively biasing the semiconductor wafer relative to said plasma of said gas, whereby said ions create a facet at the opening to the recess; and
   reducing any bias applied to the semiconductor wafer and bombarding said surface of said semiconductor wafer in said chamber with lower energy ions than said ions from both said plasma of said gas and said material to be deposited, whereby:
      there is deposited a film of said material that fills said recess, and wherein the recess is filled without voids therein, and
      there is a lower rate of accumulation of said film on said facet at the opening to the recess due to resputtering of the same relative to the rate of accumulation of said film on areas of said semiconductor wafer that are perpendicular to the direction of the sputtered flux that is sputtered from said target.

33. The method as defined in claim 32, wherein said plasma source includes an inductive coil coupled to an RF power supply.

34. The method as defined in claim 32, wherein said material to be deposited comprises titanium.

35. The method as defined in claim 32, wherein said surface of said semiconductor wafer comprises contact holes.

36. The method as defined in claim 32, wherein said surface of said semiconductor wafer comprises via holes.

37. The method as defined in claim 32, wherein said gas comprises an inert gas.

38. The method as defined in claim 37, wherein said inert gas comprises argon.

39. The method as defined in claim 32, wherein bombarding said surface of said semiconductor wafer with lower energy ions further comprises: resputtering all of said sputtered flux off of the facet at the opening of the recess that is deposited directly thereon.

40. A method for deposition on a surface of a semiconductor substrate comprising:

providing a chamber with a high density plasma source therein;

providing in said chamber a target of a material to be deposited;

positioning in said chamber a semiconductor substrate having a surface with a surface topography, said surface topography having horizontally oriented surface portions and vertically oriented surface portions, said horizontally oriented surface portions and said vertically oriented surface portions joining at upper and lower corners on said surface topography;

bombarding said semiconductor substrate in said chamber with ions from a plasma having an ionization rate of 50% or more generated by said high density plasma source while negatively basing said semiconductor substrate relative to said plasma, whereby there is removed one or more orthogonal edges at said upper corners on said surface and leaving an angled surface portion joining horizontally oriented surface portions and vertically oriented surface portions at said upper corners, said angled surface portion being a modified non-horizontal portion of said surface topography at said upper corners; and sputtering said target in said chamber in said plasma having an ionization rate of 50% or more generated by said high density plasma source . wherein a sputtered flux of said material to be deposited travels perpendicular to the horizontally oriented surface portions of said surface topography, wherein said target is sputtered while negatively biasing said target and while negatively biasing said semiconductor substrate at a bias level so as to:

allow a film of said material to be deposited on the horizontally oriented surface portions of said surface topography without being resputtered therefrom, and reduce the rate of accumulation of said film on said modified non-horizontal portion of said surface topography at said upper corners by resputtering any sputtered flux that is deposited thereon relative to the rate of accumulation of said film on the horizontally oriented surface portions of said surface topography.

41. The method as defined in claim 40, wherein said plasma source includes an inductive coil coupled to an RF power supply.

42. The method as defined in claim 40, wherein said material to be deposited comprises titanium.

43. The method as defined in claim 40, wherein said surface of said semiconductor substrate comprises contact holes.

44. The method as defined in claim 40, wherein said surface of said semiconductor substrate comprises via holes.

45. The method as defined in claim 40, wherein during the step of bombarding said semiconductor substrate the target is unbiased.

46. A fill method for a substrate having openings therein, the method comprising:

initially forming facets of openings on a biased substrate with a plasma having an ionization rate-of 50% or more produced by a high density plasma source;

subsequently utilizing the plasma to form deposits in the openings by sputtering a target material and resputtering the facets of the openings by controlling the bias to the substrate so as to prevent voids when the openings are filled with the deposited target material.

47. The method as defined in claim 46, further comprises controlling bias applied to a target during said sputtering of said target material therefrom.

48. The method as defined in claim 46, wherein said substrate is negatively biased relative to said plasma while forming said facets of the openings.

49. The method as defined in claim 46, wherein said target material is sputtered from a target that is unbiased while forming facets of openings on said biased substrate.

50. The method as defined in claim 49, wherein the openings on said biased substrate are to at least one of contact holes and via holes.

* * * * *